(12) United States Patent
Wang et al.

(10) Patent No.: US 8,184,490 B2
(45) Date of Patent: May 22, 2012

(54) SELF-CALIBRATION METHOD OF A READING CIRCUIT OF A NONVOLATILE MEMORY

(75) Inventors: Nan Wang, Shanghai (CN); Xiang Yao, Shanghai (CN)

(73) Assignee: Shanghai Hua Hong NEC Electronics Company, Ltd., Shanghai (CN)

( * ) Notice: Subject to any disclaimer, the term of this patent is extended or adjusted under 35 U.S.C. 154(b) by 414 days.

(21) Appl. No.: 12/505,599

(22) Filed: Jul. 20, 2009

(65) Prior Publication Data
US 2010/0014363 A1  Jan. 21, 2010

(30) Foreign Application Priority Data
Jul. 21, 2008  (CN) .......................... 2008 1 0043650

(51) Int. Cl.
*G11C 7/00*  (2006.01)

(52) U.S. Cl. ............... 365/189.15; 365/189.09; 365/207

(58) Field of Classification Search ......... 365/189.15 O, 365/189.09 X, 207 X, 189.15, 189.09, 207
See application file for complete search history.

(56) References Cited

U.S. PATENT DOCUMENTS

| 7,123,514 B2 * | 10/2006 | Watanabe ................ 365/185.21 |
| 7,495,955 B2 * | 2/2009 | Ido ............................ 365/185.02 |
| 7,808,842 B1 * | 10/2010 | Raghavan et al. ........ 365/189.07 |

* cited by examiner

*Primary Examiner* — VanThu Nguyen
(74) *Attorney, Agent, or Firm* — Ming Chow; Sinorica, LLC (57) ABSTRACT

A self-calibration circuit of a nonvolatile memory includes a trimming data storage module, a sense amplifier module, a logic judgment module, and a scanning module. The nonvolatile memory circuit includes a memory cell array and the self-calibration circuit of the reading circuit of the nonvolatile memory. Without requiring an additional fuse or differential unit, the self-calibration circuit of a nonvolatile memory solves a deadlock problem securely and reliably without increasing circuit area and test cost, and be widely applied to OTP, MTP and EEPROM of various processes or various nonvolatile memories such as Flash EEPROM, MRAM, and FeRAM.

14 Claims, 6 Drawing Sheets

SELF-CALIBRATION METHOD OF A READING CIRCUIT OF A NONVOLATILE MEMORY

TECHNICAL FIELD

The present invention relates to a circuit selfcalibration method, particularly to a selfcalibration method of a reading circuit of a nonvolatile memory. The present invention further relates to a calibration circuit, particularly to a selfcalibration circuit of the reading circuit of the nonvolatile memory. The present invention furthermore relates to a nonvolatile memory circuit.

BACKGROUND TECHNOLOGY

Figure 1:
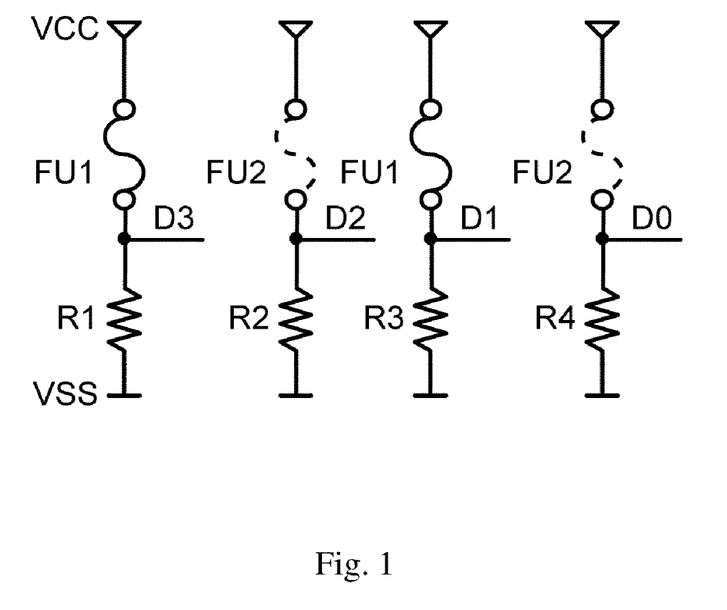
FIG. 1 is a structural schematic view of a polycrystalline fuse.

For a nonvolatile memory cell of advanced processes such as Flash EEPROM, due to decreasing dimensions, current of the Cell will change greatly under various process deviation corner. If "1" is defined as a small current and "0" a great current, it is possible that the current of Cell "1" in a fast corner is greater than that of Cell "0" in a slow corner. In order to achieve high reliability, it is required that a trimming datum is set for a reference current of the sense amplifier for different chips. This set requires storing N-bit data into a special cell of the memory, whereas the set datum needs to be retrieved when the set is read, thus resulting in deadlock. Common solutions are as below:

1. A polycrystalline fuse is adopted, as shown in FIG. 1. Number of PAD will be increased by this solution, thus increasing area of the chip and the test cost as well.

2. Laser calibration is usually adopted in a dynamic random access memory (DRAM) and a product of an owner chip factory (IDM). For a universal product of an agent factory (Foundry), this method is seldom adopted due to significant increase of test equipment investment and test cost.

Figure 2:
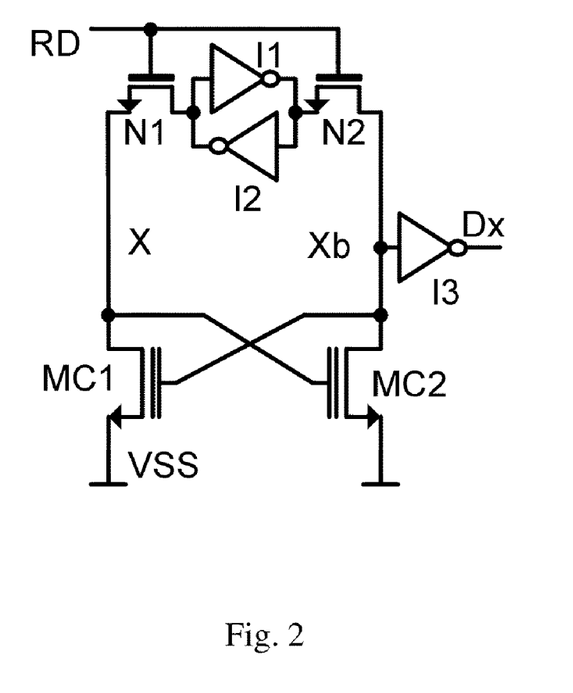
FIG. 2 is a structural schematic view of a nonvolatile static random access memory.

3. A differential nonvolatile memory is adopted, as shown in FIG. 2, such as a nonvolatile static random access memory (nonvolatile SRAM). That is, a new circuit module outside and independent of the nonvolatile memory module stores each data bit using two physical cells based on the differential principle, with the storage results contrary to each other. The additional storage module that this solution introduces will increase the chip area, and an additional test on this module is required during test of a silicon chip as well, thus increasing the test cost.

CONTENTS OF THE INVENTION

The purpose of the present invention is to provide a selfcalibration method and circuit of a reading circuit of a nonvolatile memory, as well as a nonvolatile memory circuit, which can solve the deadlock problem securely and reliably without increasing the circuit area and the test cost, and be widely applied to various nonvolatile memories such as Flash EEPROM, improving reliability of the memory effectively.

In order to achieve the above purpose, the technical solution of the present invention for the selfcalibration method of the reading circuit of the nonvolatile memory is as below: Binary trimming data are stored in a bit-pair form into the memory, whose value has recorded a value of a reference current required by the memory for normal work; the bit-pair form means that each digit of the trimming data is represented by 2-digit different binary numbers "0" and "1" with a changed order; after the memory circuit is powered on, a sense amplifier controlling the value of the reference current is regulated, and when "0" and "1" in the outputted trimming data stored in the bit-pair form have the same quantities, the trimming data are read, thus obtaining the value of the reference current, according to which the outputted reference current of the sense amplifier is controlled.

The technical solution of the present invention for the circuit executing the selfcalibration method of the reading circuit of the nonvolatile memory is as below: The circuit includes a trimming data storage module, a sense amplifier module, a logic judgment module, and a scanning module.

The trimming data storage module stores the binary trimming data in the bit-pair form, whose value has recorded the value of the reference current required by the memory for normal work. The bit-pair form means that each digit of the trimming data is represented by 2-digit different binary numbers "0" and "1" with a changed order.

The sense amplifier module is connected by signal with the scanning module and the trimming data storage module, and regulates in the selfcalibration process the reference current of the memory according to the signal of the scanning module. After selfcalibration the value of the trimming data is read that are stored in the trimming data storage module, and the reference current of the memory is regulated according to the value.

The logic judgment module judges at real time quantities of the outputted "0" and "1" of the trimming data storage module, and transmits the judgment result to the scanning module.

The scanning module regulates the reference current of the sense amplifier, according to the judgment result of the logic judgment module, in such a way that the outputted "0" and "1" of the trimming data storage module are inclined to have the same quantities, until the outputted "0" and "1" of the trimming data storage module have the same quantities, here the selfcalibration being finished.

The present invention further provides a nonvolatile memory circuit adopting the above selfcalibration circuit of the reading circuit of the nonvolatile memory, the nonvolatile memory circuit including:

a memory cell array, including a common storage area and a trimming data storage area; and the selfcalibration method of the reading circuit of the nonvolatile memory, including the following modules:

the trimming data storage module, located in a trimming data storage area in the memory cell array and storing the binary trimming data in the bit-pair form, whose value has recorded the value of the reference current required by the memory for normal work; the bit-pair form means that each digit of the trimming data is represented by 2-digit different binary numbers "0" and "1" with a changed order;

the sense amplifier module, connected by signal with the scanning module and the trimming data storage module and regulating in the selfcalibration process the reference current of the memory according to the signal of the scanning module; after selfcalibration the value of the trimming data is read that are stored in the trimming data storage module, and the reference current of the memory is regulated according to the value;

the logic judgment module, judging at real time quantities of the outputted "0" and "1" of the trimming data storage module and transmitting the judgment result to the scanning module; and the scanning module, regulating the reference current of the sense amplifier, according to the judgment result of the logic judgment module, in such a way that the outputted "0" and "1" of the trimming data storage module are inclined to have the same quantities, until the outputted "0" and "1" of the trimming data storage module have the same quantities, here the selfcalibration being finished.

The present invention, not requiring an additional fuse or difference unit, can solve a deadlock problem securely and reliably without increasing circuit area and test cost, and be widely applied to OTP, MTP and EEPROM of various processes or various nonvolatile memories such as Flash EEPROM, improving reliability of the memory effectively.

DESCRIPTION OF THE DRAWINGS

The present invention will further be described below in detail with reference to drawings and embodiments.

EMBODIMENTS OF THE INVENTION

The present invention discloses a selfcalibration method of a reading circuit of a nonvolatile memory, by which binary trimming data are stored in a bit-pair form into the memory during a product test, a value of the trimming data having recorded a value of a reference current required by the memory for normal work, the bit-pair form meaning that each digit of the trimming data is represented by 2-digit different binary numbers "0" and "1" with a changed order; after the memory circuit is powered on, a sense amplifier controlling the value of the reference current is regulated, and when "0" and "1" in the outputted trimming data stored in the bit-pair form have the same quantities, the trimming data are read, thus obtaining the value of the reference current, according to which the outputted reference current of the sense amplifier is controlled.

In an embodiment of the above technical solution, "0" is represented by a 2-digit binary number "01", and "1" by a 2-digit binary number "10". Therefore, an original trimming datum such as "1101" will be "10100110" if represented in the bit-pair form. The quantities of "0" and "1" of any of the binary numbers will be equal after the number is represented in this form. Therefore, if the outputted "0" and "1" have the same quantities, the outputted trimming data stored in the bit-pair form can be considered to be reliable, and used as a basis according to which the reference current is outputted; and if the outputted "0" and "1" have different quantities, it indicates that the trimming data currently outputted are not accurate enough, and one needs to keep on regulating the sense amplifier, until "0" and "1" have the same quantities.

Figure 3:
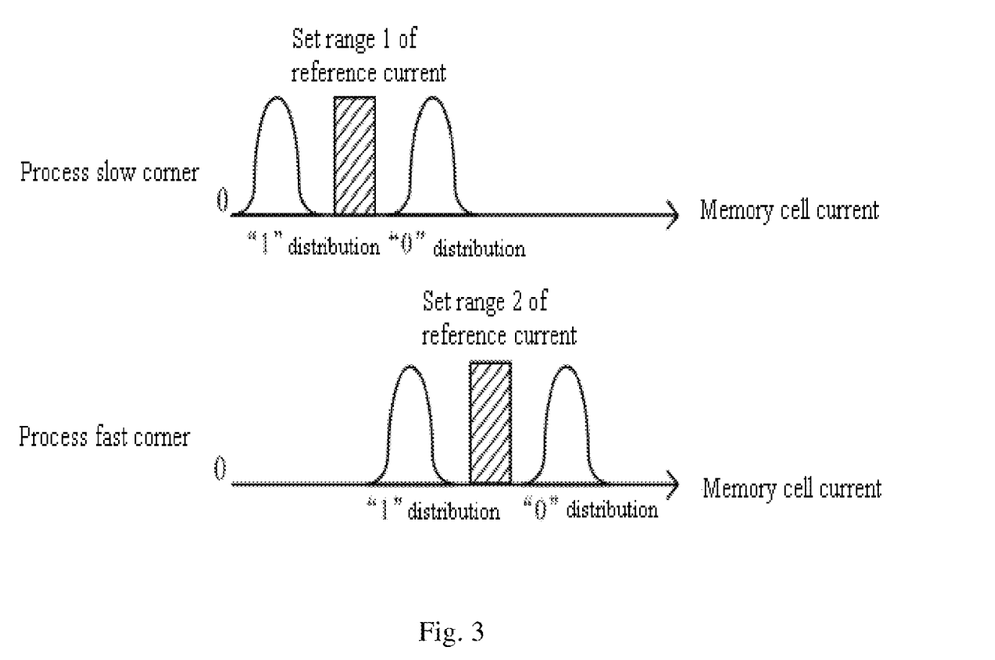
FIG. 3 is a schematic view of characteristics of a nonvolatile memory cell.

For example, as shown in FIG. 3, "1" is defined as a small current and "0" a great current. If the reference current is set in the reference range 1, the data can be read reliably under the Slow Corner condition, that is, "0" and "1" can be distinguished reliably; whereas the data cannot be read reliably under the Fast Corner condition, and "1" may be judged as "0" by mistake. If the reference current is set in the reference range 2, the data can be read reliably under the Fast Corner condition, that is, "0" and "1" can be distinguished reliably; whereas the data cannot be read reliably under the Slow Corner condition, and "0" may be judged as "1" by mistake. Therefore, during a chip test, a value of an intermediate current in the reference range, i.e. the trimming datum, is written into a special interval by measuring a minimum current of Cell "0" (or a corresponding threshold voltage) and a maximum current of Cell "1" (or a corresponding threshold voltage). When a chip works practically, the selfcalibration circuit can read this datum accurately by the method of successive approximation and successive comparison, which is used to set the reference current, so as to provide a suitable reference current for the chips of different processes and ensure that the circuit works normally.

After the memory is powered on, a binary search method can be adopted for scanning when the sense amplifier controlling the value of the reference current is regulated; that is, the scan is started from an intermediate value in the range of the outputted reference current of the sense amplifier, quantities of "0" and "1" are compared in the outputted trimming data stored in the bit-pair form, and if "0" and "1" have different quantities, the sense amplifier is such regulated that "0" and "1" are inclined to have the same quantities, until "0" and "1" have the same quantities.

After the memory is powered on, a sequential search method can also be adopted for scanning when the sense amplifier controlling the value of the reference current is regulated; that is, the scan is started from a minimum value in the range of the outputted reference current of the sense amplifier, quantities of "0" and "1" are compared in the outputted trimming data stored in the bit-pair form, and if "0" and "1" have different quantities, the current is increased, until "0" and "1" have the same quantities; or the scan is started from a maximum value in the range of the outputted reference current of the sense amplifier, quantities of "0" and "1" are compared in the outputted trimming data stored in the bit-pair form, and if "0" and "1" have different quantities, the current is decreased, until "0" and "1" have the same quantities.

When the sense amplifier is regulated, a numerical method can be adopted for regulating the sense amplifier, and data controlling the sense amplifier change each time a clock signal is received, thus changing the value of the outputted reference current of the sense amplifier.

The memory storing the binary trimming data in the bit-pair form is a static memory.

Figure 4:
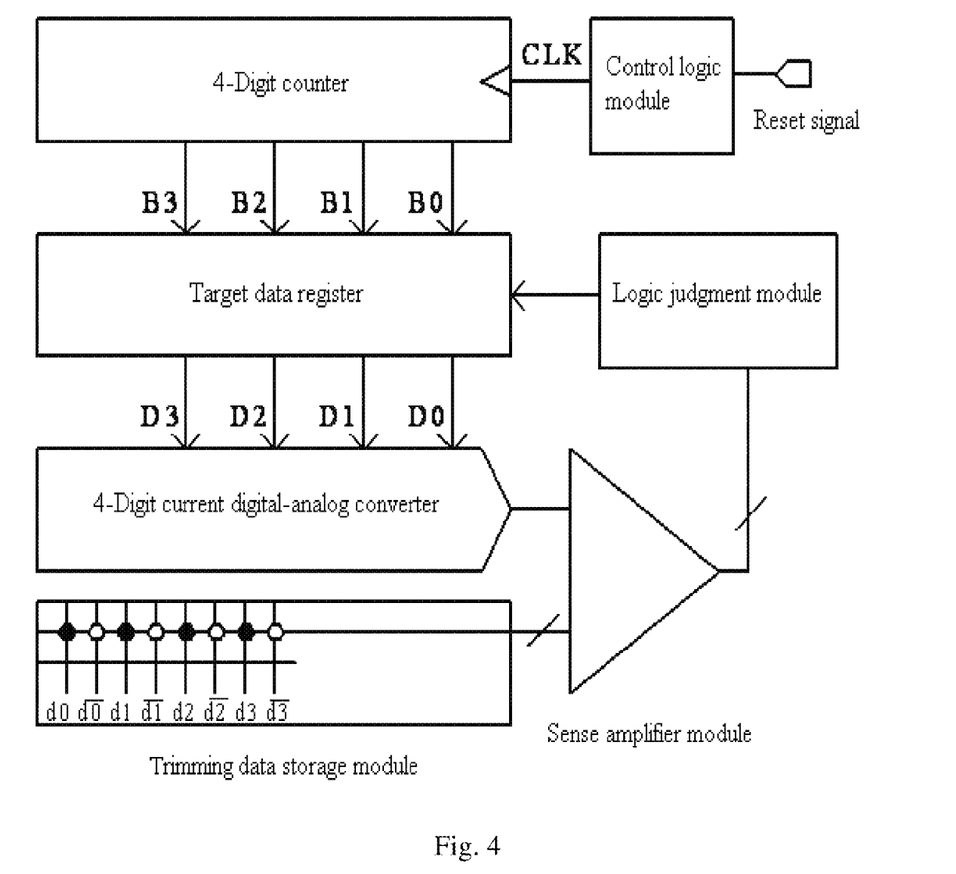
FIG. 4 is a structural schematic view of the selfcalibration circuit of the reading circuit of the nonvolatile memory of the present invention.

The present invention further discloses a circuit for executing the above selfcalibration method of the reading circuit of the nonvolatile memory, as shown in FIG. 4, the circuit including a trimming data storage module, a sense amplifier module, a logic judgment module, and a scanning module.

The trimming data storage module stores the binary trimming data in the bit-pair form, whose value has recorded the value of the reference current required by the memory for normal work. The bit-pair form means that each digit of the trimming data is represented by 2-digit different binary numbers "0" and "1" with a changed order.

Figure 5:
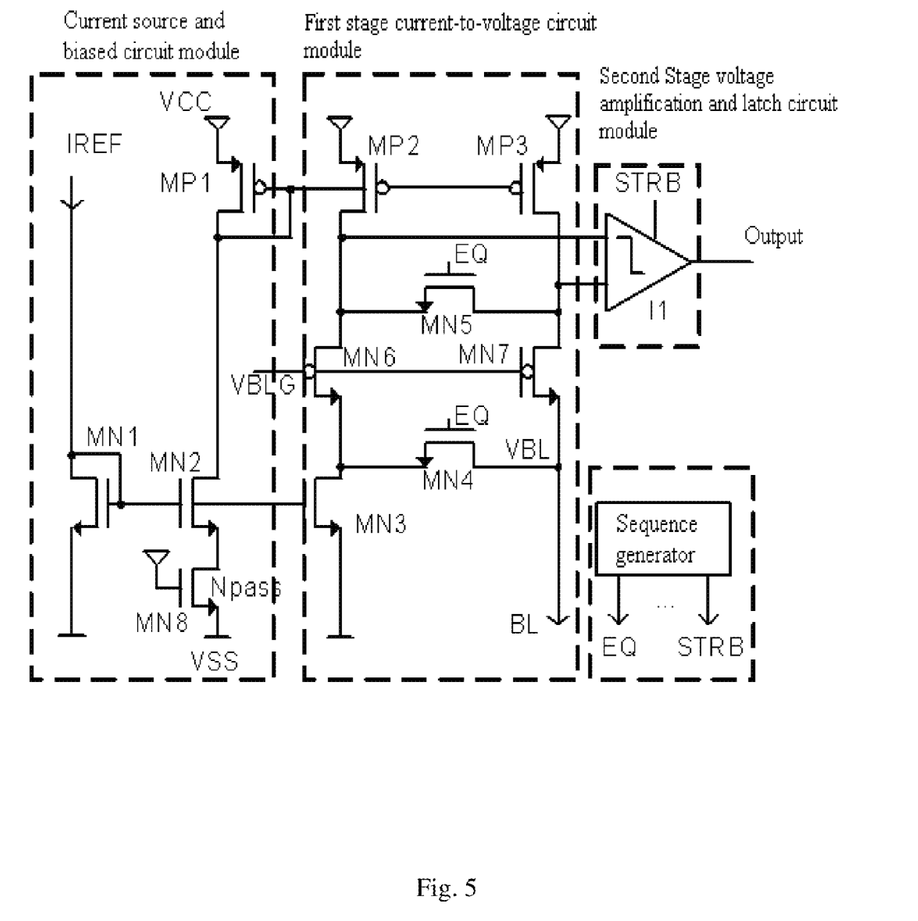
FIG. 5 is a circuit diagram of the sense amplifier module in the selfcalibration circuit of the reading circuit of the nonvolatile memory of the present invention.

The sense amplifier module, as shown in FIG. 5 that is a circuit diagram of an existing sense amplifier module, includes a current source and biased circuit module, a primary current-to-voltage circuit module, and a secondary voltage amplification and latch circuit module. The sense amplifier module is connected by signal with the scanning module and the trimming data storage module, and regulates in the selfcalibration process the reference current of the memory according to the signal of the scanning module. The reference current is inputted from the IREF terminal into the sense amplifier, mirrored to MN3 via MN1, and compared with the current of the Cell through which BL flows. After selfcalibration the value of the trimming data is read that are stored in the trimming data storage module, and the reference current of the memory is regulated according to the value.

The logic judgment module judges at real time quantities of the outputted "0" and "1" of the trimming data storage module, and transmits the judgment result to the scanning module.

The scanning module regulates the reference current of the sense amplifier, according to the judgment result of the logic judgment module, in such a way that the outputted "0" and "1" of the trimming data storage module are inclined to have the same quantities, until the outputted "0" and "1" of the trimming data storage module have the same quantities, here the selfcalibration being finished.

The scanning module includes a target data register and a digital-analog converter. The digital-analog converter converts the data in the target data register into the analog signal, which is connected to the sense amplifier module, regulating the reference current of the sense amplifier module. While the reference current is regulated, the data in the target data register are determined digit by digit from high-order digit to low-order digit, which is started from the intermediate value in the range of the data stored in the target data register, according to the real-time judgment result of the logic judgment module, in such a way that the outputted "0" and "1" of the trimming data storage module are inclined to have the same quantities, until the outputted "0" and "1" of the trimming data storage module have the same quantities.

A target data register that can store 4-digit binary data, as shown in FIG. 4, is taken as an example, and "1" is defined as a small current and "0" a great current. All the digits are cleared that are behind the current digit "1" from the highest digit of the target data register, here with one of the following three results:

1. The outputted "0" and "1" of the trimming data storage module have the same quantities, which indicates that the outputted data of the trimming data storage module are accurate and reliable, and the sense amplifier module can regulate the outputted reference current according to the data.

2. "0" has a greater quantity than "1" outputted from the trimming data storage module, which indicates that the current reference current is somewhat small, and the datum at the current digit of the target data register is reserved as "1".

3. "0" has a smaller quantity than "1" outputted from the trimming data storage module, which indicates that the current reference current is somewhat great, and the datum at the current digit of the target data register is reserved as "0".

Each digit of the data in the target data register is processed as above digit by digit from high-order digit to low-order digit, until the first result is achieved when a certain digit is processed.

The target data register is connected with a counter, which has the same number of digits with the target data register. The counter is connected to the reset signal and begins to count after the reset signal is triggered, and the target data register determines a value of a data bit from high-order digit to low-order digit each time a number is counted. The selfcalibration process of the present invention can surely be completed before the counter finishes a cycle count, and therefore this counter can be used to send out a signal indicating that the selfcalibration is finished.

Figure 6:
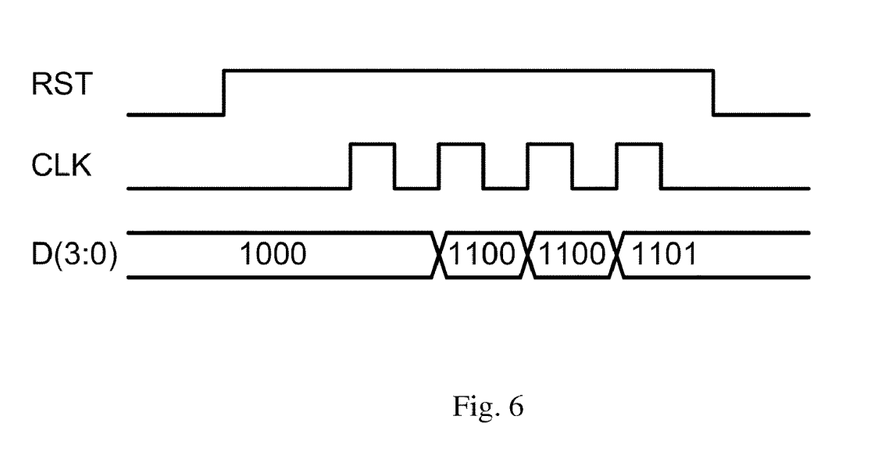
FIG. 6 is a control sequence diagram of an embodiment of the selfcalibration circuit of the reading circuit of the nonvolatile memory of the present invention.

As shown in FIGS. 4 and 6, the reset signal is connected to a logic control module. When the reset signal RST is effective, the logic control module sends the clock signal CLK to the counter, which counts the clock signal. At the same time, the target data register determines its value D (3:0) digit by digit, with the sequence as shown in FIG. 6. When the counter completes a cycle of technology, the trimming data stored in the trimming data module storage can then also be read correctly.

Figure 7:
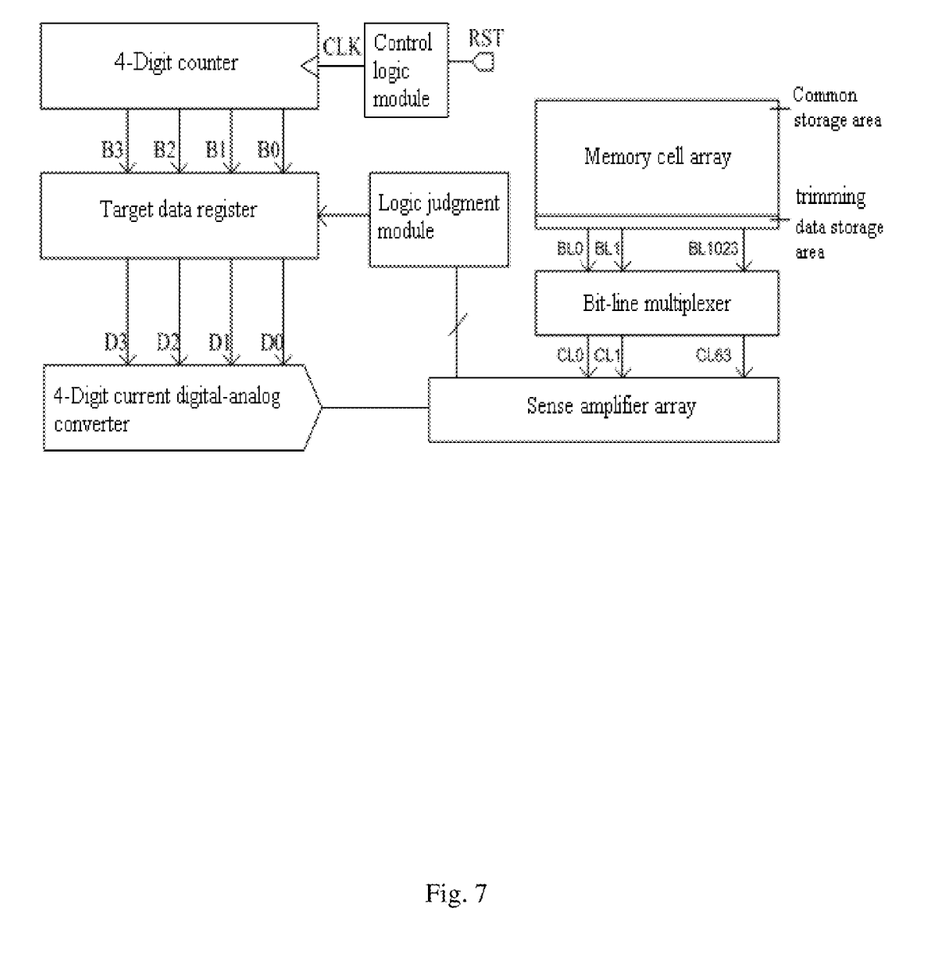
FIG. 7 is a structural schematic view of the nonvolatile memory circuit of the present invention.

The present invention further provides a nonvolatile memory circuit adopting the above selfcalibration circuit of the reading circuit of the nonvolatile memory, as shown in FIG. 7, the nonvolatile memory circuit including:

the memory cell array, including a common storage area and a trimming data storage area; and the selfcalibration method of the reading circuit of the nonvolatile memory, including the following modules:

the trimming data storage module, located in a trimming data storage area in the memory cell array and storing the binary trimming data in the bit-pair form, whose value has recorded the value of the reference current required by the memory for normal work; the bit-pair form means that each digit of the trimming data is represented by 2-digit different binary numbers "0" and "1" with a changed order;

the sense amplifier module, connected by signal with the scanning module and the trimming data storage module and regulating in the selfcalibration process the reference current of the memory according to the signal of the scanning module; after selfcalibration the value of the trimming data is read that are stored in the trimming data storage module, and the reference current of the memory is regulated according to the value;

the logic judgment module, judging at real time quantities of the outputted "0" and "1" of the trimming data storage module and transmitting the judgment result to the scanning module; and the scanning module, regulating the reference current of the sense amplifier, according to the judgment result of the logic judgment module, in such a way that the outputted "0" and "1" of the trimming data storage module are inclined to have the same quantities, until the outputted "0" and "1" of the trimming data storage module have the same quantities, here the selfcalibration being finished.

The nonvolatile memory circuit further includes a bit-line multiplexer, which transmits each trimming datum to a sense amplifier module corresponding to the datum, multiple sense amplifier modules constituting an amplifier module array. The memory circuit generally includes multiple memory devices made by different processes, and therefore these different devices will have their own reference currents for normal work, so as to enable all the memory cells to work normally. Hence, each of the memory devices requires its own sense amplifier to provide the reference current for it. The bit-line multiplexer is used to transmit the trimming data of each device accurately to the sense amplifier of this device, and the sense amplifier can then provide the accurate reference current for this device according to the trimming data.

The scanning module includes a target data register and a digital-analog converter. The digital-analog converter converts the data in the target data register into the analog signal, which is connected to the sense amplifier module, regulating the reference current of the sense amplifier module. While the reference current is regulated, the data in the target data register are determined digit by digit from high-order digit to low-order digit, which is started from the intermediate value in the range of the data stored in the target data register, according to the real-time judgment result of the logic judgment module, in such a way that the outputted "0" and "1" of the trimming data storage module are inclined to have the same quantities, until the outputted "0" and "1" of the trimming data storage module have the same quantities.

The target data register is connected with a counter, which has the same number of digits with the target data register. The counter is connected to the reset signal and begins to count after the reset signal is triggered, and the target data register determines a value of a data bit from high-order digit to low-order digit each time a number is counted.

In the present invention, the data of the target data register regulate the sense amplifier module, so as to read accurately the trimming data stored in the trimming data storage module. However, because the whole system may include many memory cells, it is unlikely that the data of all the memory cells can be read accurately when the reference current of the trimming data can be read accurately. Therefore, it is required, after the trimming data are read accurately, to enable the sense amplifier module to output the accurate reference current according to the value of the trimming data, and to enable all the data of the memory cells to be read accurately.

In summary, the present invention, not requiring an additional fuse or difference unit, can solve a deadlock problem securely and reliably without increasing circuit area and test cost, and be widely applied to OTP, MTP and EEPROM of various processes or various nonvolatile memories such as Flash EEPROM, improving reliability of the memory effectively.

What is claimed is:

1. A self-calibration method of a reading circuit of a nonvolatile memory, wherein binary trimming data are stored in a bit-pair form into the memory, a value of the trimming data having recorded a value of a reference current required by the memory for normal work, the bit-pair form meaning that each digit of the trimming data is represented by 2-digit different binary numbers "0" and "1" with a changed order; after the memory circuit is powered on, a sense amplifier controlling the value of the reference current is regulated, and when "0" and "1" in the outputted trimming data stored in the bit-pair form have the same quantities, the trimming data are read, thus obtaining the value of the reference current, according to which the outputted reference current of the sense amplifier is controlled.

2. The self-calibration method of the reading circuit of the nonvolatile memory according to claim 1, wherein after the memory is powered on, a binary search method is adopted for scanning when the sense amplifier controlling the value of the reference current is regulated; that is, the scan is started from an intermediate value in a range of the outputted reference current of the sense amplifier, quantities of "0" and "1" are compared in the outputted trimming data stored in the bit-pair form, and if "0" and "1" have different quantities, the sense amplifier is such regulated that "0" and "1" are inclined to have the same quantities, until "0" and "1" have the same quantities.

3. The self-calibration method of the reading circuit of the nonvolatile memory according to claim 1, wherein after the memory is powered on, a sequential search method is adopted for scanning when the sense amplifier controlling the value of the reference current is regulated; that is, the scan is started from a minimum value in the range of the outputted reference current of the sense amplifier, quantities of "0" and "1" are compared in the outputted trimming data stored in the bit-pair form, and if "0" and "1" have different quantities, the current is increased, until "0" and "1" have the same quantities; or the scan is started from a maximum value in the range of the outputted reference current of the sense amplifier, quantities of "0" and "1" are compared in the outputted trimming data stored in the bit-pair form, and if "0" and "1" have different quantities, the current is decreased, until "0" and "1" have the same quantities.

4. The self-calibration method of the reading circuit of the nonvolatile memory according to any of claims 1, wherein a numerical method is adopted for regulating the sense amplifier, and data controlling the sense amplifier change each time a clock signal is received, thus changing the value of the outputted reference current of the sense amplifier.

5. The self-calibration method of the reading circuit of the nonvolatile memory according to any of claims 2, wherein a numerical method is adopted for regulating the sense amplifier, and data controlling the sense amplifier change each time a clock signal is received, thus changing the value of the outputted reference current of the sense amplifier.

6. The self-calibration method of the reading circuit of the nonvolatile memory according to any of claims 3, wherein a numerical method is adopted for regulating the sense amplifier, and data controlling the sense amplifier change each time a clock signal is received, thus changing the value of the outputted reference current of the sense amplifier.

7. The self-calibration method of the reading circuit of the nonvolatile memory according to claim 1, wherein the memory storing the binary trimming data in the bit-pair form is a static memory.

8. A circuit for executing a self-calibration method of a reading circuit of a nonvolatile memory, wherein the circuit includes a trimming data storage module, a sense amplifier module, a logic judgment module, and a scanning module;

the trimming data storage module is used for storing the binary trimming data in the bit-pair form, whose value has recorded the value of the reference current required by the memory for normal work; and the bit-pair form means that each digit of the trimming data is represented by 2-digit different binary numbers "0" and "1" with a changed order;

the sense amplifier module is connected by signal with the scanning module and the trimming data storage module, and regulates in the self-calibration process the reference current of the memory according to a signal of the scanning module; after self-calibration the value of the trimming data is read that are stored in the trimming data storage module, and the reference current of the memory is regulated according to the value;

the logic judgment module judges at real time the quantities of outputted "0" and "1" of the trimming data storage module, and transmits the judgment result to the scanning module; and the scanning module regulates the reference current of the sense amplifier, according to the judgment result of the logic judgment module, in such a way that the outputted "0" and "1" of the trimming data storage module are inclined to have the same quantities, until the outputted "0" and "1" of the trimming data storage module have the same quantities, here the self-calibration being finished.

9. The circuit for executing a self-calibration method according to claim 8, wherein the scanning module includes a target data register and a digital-analog converter; the digital-analog converter converts the data in the target data register into an analog signal, which is connected to the sense amplifier module, regulating the reference current of the sense amplifier module; while the reference current is regulated, the data in the target data register are determined digit by digit from MSB(Most significant bit) to LSB(Least significant bit), which is started from an intermediate value in a range of the data stored in the target data register, according to the real-time judgment result of the logic judgment module, in such a way that the outputted "0" and "1" of the trimming data storage module are inclined to have the same quantities, until the outputted "0" and "1" of the trimming data storage module have the same quantities.

10. The circuit for executing a self-calibration method according to claim 9, wherein the target data register is connected with a counter, which has the same number of digits with the target data register; the counter is connected to a reset signal and begins to count after the reset signal is triggered, and the target data register determines a value of a data bit from high-order digit to low-order digit each time a number is counted.

11. A nonvolatile memory circuit adopting a self-calibration circuit of a reading circuit comprising:
   a memory cell array, including a common storage area and a trimming data storage area; and
   the self-calibration circuit of the reading circuit of the nonvolatile memory, including the following modules:
   the trimming data storage module, located in a trimming data storage area in the memory cell array and storing the binary trimming data in the bit-pair form, whose value has recorded the value of the reference current required by the memory for normal work; the bit-pair form means that each digit of the trimming data is represented by 2-digit different binary numbers "0" and "1" with a changed order;
   the sense amplifier module, connected by signal with the scanning module and the trimming data storage module and regulating in the self-calibration process the reference current of the memory according to the signal of the scanning module; after self-calibration the value of the trimming data is read that are stored in the trimming data storage module, and the reference current of the memory is regulated according to the value;
   the logic judgment module, judging at real time the quantities of the outputted "0" and "1" of the trimming data storage module and transmitting the judgment result to the scanning module; and
   the scanning module, regulating the reference current of the sense amplifier, according to the judgment result of the logic judgment module, in such a way that the outputted "0" and "1" of the trimming data storage module are inclined to have the same quantities, until the outputted "0" and "1" of the trimming data storage module have the same quantities, here the self-calibration being finished.

12. The nonvolatile memory circuit adopting a self-calibration circuit of a reading circuit according to claim 11, wherein it further includes a bit-line multiplexer, which transmits each trimming datum to a sense amplifier module corresponding to the datum, multiple sense amplifier modules constituting an amplifier module array.

13. The nonvolatile memory circuit adopting a self-calibration circuit of a reading circuit according to claim 11, wherein the scanning module includes a target data register and a digital-analog converter; the digital-analog converter converts the data in the target data register into the analog signal, which is connected to the sense amplifier module, regulating the reference current of the sense amplifier module; while the reference current is regulated, the data in the target data register are determined digit by digit from MSB (Most significant bit) to LSB(Least significant bit), which is started from the intermediate value in the range of the data stored in the target data register, according to the real-time judgment result of the logic judgment module, in such a way that the outputted "0" and "1" of the trimming data storage module are inclined to have the same quantities, until the outputted "0" and "1" of the trimming data storage module have the same quantities.

14. The nonvolatile memory circuit adopting a self-calibration circuit of a reading circuit according to claim 13, wherein the target data register is connected with a counter, which has the same number of digits with the target data register; the counter is connected to the reset signal and begins to count after the reset signal is triggered, and the target data register determines a value of a data bit from high-order digit to low-order digit each time a number is counted.

* * * * *